(12) United States Patent
Kurahashi et al.

(10) Patent No.: US 9,893,210 B2
(45) Date of Patent: Feb. 13, 2018

(54) SEMICONDUCTOR DEVICE AND METHOD OF MANUFACTURING THE SAME

(71) Applicant: Mitsubishi Electric Corporation, Tokyo (JP)

(72) Inventors: Kenichiro Kurahashi, Tokyo (JP); Takuma Nanjo, Tokyo (JP); Muneyoshi Suita, Tokyo (JP); Akifumi Imai, Tokyo (JP); Eiji Yagyu, Tokyo (JP); Hiroyuki Okazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/173,740

(22) Filed: Jun. 6, 2016

(65) Prior Publication Data

US 2017/0092783 A1    Mar. 30, 2017

(30) Foreign Application Priority Data

Sep. 24, 2015 (JP) ................................. 2015-186744

(51) Int. Cl.
| | |
|---|---|
| *H01L 29/04* | (2006.01) |
| *H01L 29/812* | (2006.01) |
| *H01L 29/06* | (2006.01) |
| *H01L 29/40* | (2006.01) |
| *H01L 29/66* | (2006.01) |
| *H01L 29/80* | (2006.01) |

(Continued)

(52) U.S. Cl.
CPC .......... *H01L 29/812* (2013.01); *H01L 23/291* (2013.01); *H01L 29/0649* (2013.01); *H01L 29/402* (2013.01); *H01L 29/408* (2013.01); *H01L 29/513* (2013.01); *H01L 29/518* (2013.01); *H01L 29/66462* (2013.01); *H01L 29/7786* (2013.01); *H01L 29/802* (2013.01); *H01L 29/42376* (2013.01)

(58) Field of Classification Search
CPC ............................ H01L 29/802; H01L 29/812
USPC .......................................................... 257/59
See application file for complete search history.

(56) References Cited

U.S. PATENT DOCUMENTS

| | | |
|---|---|---|
| 2003/0020092 A1 | 1/2003 | Parikh et al. |
| 2006/0102929 A1 | 5/2006 | Okamoto et al. |

(Continued)

FOREIGN PATENT DOCUMENTS

| | | |
|---|---|---|
| JP | 2004-200248 A | 7/2004 |
| JP | 2008-205392 A | 9/2008 |

(Continued)

OTHER PUBLICATIONS

Hasegawa et al. (2006) "Wide Gap Semiconductor Optical/Electronic Device" Morikita Publishing, Co., Ltd. pp. 245-246.

(Continued)

*Primary Examiner* — David Vu
*Assistant Examiner* — Brandon Fox
(74) *Attorney, Agent, or Firm* — Studebaker & Brackett PC (57) ABSTRACT

A semiconductor device includes: a substrate; a nitride semiconductor layer on the substrate; a source electrode, a drain electrode and a gate electrode on the nitride semiconductor layer; and a SiN surface protective film covering the nitride semiconductor layer, wherein a composition ratio Si/N of Si and N that form a Si—N bond of the SiN surface protective film is 0.751 to 0.801.

16 Claims, 8 Drawing Sheets

(51) Int. Cl.
*H01L 23/29* (2006.01)
*H01L 29/51* (2006.01)
*H01L 29/778* (2006.01)
*H01L 29/423* (2006.01)

(56) References Cited

U.S. PATENT DOCUMENTS

| | | |
|---|---|---|
| 2006/0220063 A1 | 10/2006 | Kurachi et al. |
| 2008/0203541 A1 | 8/2008 | Makiyama |
| 2009/0001381 A1* | 1/2009 | Marui .............. H01L 29/0653 257/76 |
| 2013/0153963 A1* | 6/2013 | Shealy .............. H01L 23/291 257/190 |
| 2013/0264657 A1* | 10/2013 | Komatani .......... H01L 29/7848 257/402 |
| 2014/0097469 A1 | 4/2014 | Hagleitner et al. |
| 2014/0284613 A1* | 9/2014 | Kuraguchi ........ H01L 29/66462 257/76 |
| 2015/0145004 A1 | 5/2015 | Inoue et al. |
| 2016/0056274 A1* | 2/2016 | Kawaguchi .......... H01L 29/423 257/192 |

FOREIGN PATENT DOCUMENTS

| | | |
|---|---|---|
| JP | 2009-010107 A | 1/2009 |
| JP | 4912604 B2 | 1/2012 |
| JP | 2013-115323 A | 6/2013 |
| JP | 2014-078537 A | 5/2014 |
| JP | 2014-187084 A | 10/2014 |
| KR | 10-0920434 B1 | 10/2009 |
| KR | 10-2015-0062135 A | 6/2015 |
| KR | 10-2015-0065786 A | 6/2015 |

OTHER PUBLICATIONS

An Office Action issued by the Korean Patent Office on Sep. 26, 2017, which corresponds to Korean Patent Application 10-2016-0120404 and is related to U.S. Appl. No. 15/173,740; with English translation.

* cited by examiner

SEMICONDUCTOR DEVICE AND METHOD OF MANUFACTURING THE SAME

BACKGROUND OF THE INVENTION

Field

The present invention relates to a semiconductor device including a SiN surface protective film and a method of manufacturing the same.

Background

Since GaN has a higher dielectric breakdown voltage than Si or GaAs, nitride semiconductor devices (GaN-based transistors) are devices expected to realize a high voltage/high output operation. An AlGaN/GaN heterojunction structure is typically known as a structure of nitride semiconductor devices.

However, in a region where the nitride semiconductor devices have a high operating voltage, a phenomenon called "current collapse" occurs in which a current decreases significantly during high-frequency operation. When current collapse occurs, output power which is expected to be obtained from DC characteristics cannot be obtained, and it is therefore necessary to suppress the current collapse.

Possible major causes for current collapse include temporary trapping of electrons in an impurity level and an interfacial level formed in an AlGaN crystal, a GaN crystal or on the AlGaN surface or the like during a high-voltage operation, and the occurrence of current constriction.

It is a known fact that applying SiN to a surface protective film drastically suppresses current collapse (e.g., see Fumio Hasegawa, edited by Akihiko Yoshikawa, "Wide Gap Semiconductor Optical/Electronic Device," MOREKITA PUBLISHING, Co., Ltd. 2006, p. 245-246). However, since current collapse cannot be sufficiently suppressed by applying only SiN, a technique is disclosed which defines a SiN composition, film formation method and conditions and combination with other insulating films or the like (e.g., see JP 2009-10107 A, JP 2013-115323 A and JP 4912604 A). According to JP 2009-10107 A, SiN with excessive nitrogen (N) is used using an etching rate of a chemical solution as a main index. On the other hand, JP 2013-115323 A and JP 4912604 A focus on a SiN ratio and describe that SiN with excessive silicon (Si) is used.

However, according to JP 2009-10107 A, JP 2013-115323 A and JP 4912604 A, since no conditions for the SiN surface protective film that should be essentially satisfied to suppress current collapse are defined, there is a problem that it is not possible to obtain sufficient reproducibility with respect to the current collapse suppressing effect.

SUMMARY

The present invention has been implemented to solve the above-described problems and it is an object of the present invention to provide a semiconductor device and a method of manufacturing the same capable of suppressing current collapse with high reproducibility.

According to the present invention, a semiconductor device includes: a substrate; a nitride semiconductor layer on the substrate; a source electrode, a drain electrode and a gate electrode on the nitride semiconductor layer; and a SiN surface protective film covering the nitride semiconductor layer, wherein a composition ratio Si/N of Si and N that form a Si—N bond of the SiN surface protective film is 0.751 to 0.801.

In the present invention, the composition ratio Si/N of Si and N that form the Si—N bond of the SiN surface protective film is 0.751 to 0.801. This reduces the energy of the SiN/AlGaN interface, making it possible to reduce current collapse with high reproducibility.

Other and farther objects, features and advantages of the invention will appear more fully from the following description.

DESCRIPTION OF EMBODIMENTS

A semiconductor device and a method of manufacturing the same according to the embodiments of the present invention will be described with reference to the drawings. The same components will be denoted by the same symbols, and the repeated description thereof may be omitted.

First Embodiment

Figure 1:
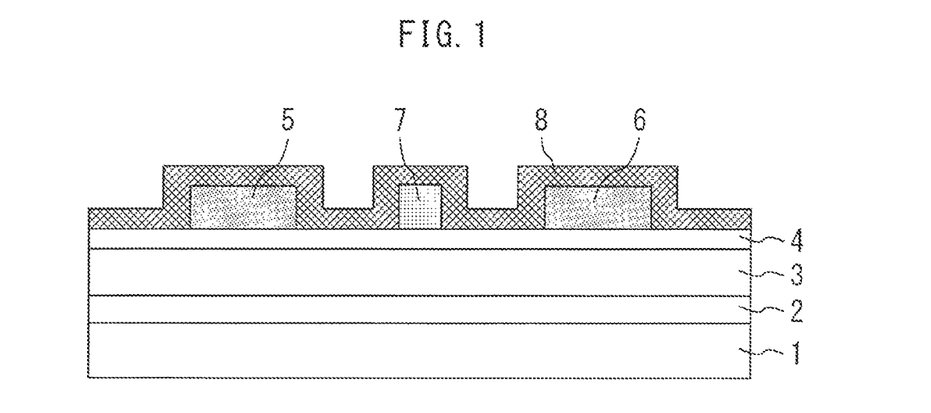
FIG. 1 is a cross-sectional view illustrating a semiconductor device according to a first embodiment of the present invention.

FIG. 1 is a cross-sectional view illustrating a semiconductor device according to a first embodiment of the present invention. This semiconductor device is a heterostructure field-effect transistor.

A buffer layer 2, a GaN channel layer 3 and an AlGaN barrier layer 4 are formed on a substrate 1 in that order. The substrate 1 is a SiC substrate, sapphire substrate or silicon substrate or the like, but can be any kind of substrate if the GaN channel layer 3 can be formed thereon. The buffer layer 2 is GaN or AlN or the like, but can be any kind of layer if the GaN channel layer 3 can be formed thereon. For example, if the GaN channel layer 3 can be formed, the buffer layer 2 may have a double-heterostructure. The outermost semiconductor surface layer is the AlGaN barrier layer 4, but can be an InAlN barrier layer. Moreover, a GaN cap layer may be formed on the AlGaN barrier layer 4 as required.

A source electrode 5, a drain electrode 6 and a gate electrode 7 are formed on the AlGaN barrier layer 4 which is the outermost surface layer. The source electrode 5 and the drain electrode 6 are separated from each other across the gate electrode 7.

The source electrode 5 and the drain electrode 6 are ohmically connected to the AlGaN barrier layer 4. The source electrode 5 and the drain electrode 6 typically have a Ti/Al structure and ohmic junction is obtained by forming Ti (20 nm)/Al (100 nm)/Ti (40 nm)/Au (30 nm) and performing annealing at 600° C. or above. In addition, any given electrode structure and ohmic formation process may be applied as required.

The gate electrode 7 is Schottky-connected to the AlGaN barrier layer 4 to form a MES (metal-semiconductor) structure. The gate electrode 7 typically has a Ni/Au structure, which is formed of Ni (50 nm)/Au (300 nm) through vapor deposition or using a sputtering lift-off process. In addition, Pt- or a Pd-based electrode material having a high Schottky barrier can also be used.

A SiN surface protective film 8 covers the AlGaN barrier layer 4. The AlGaN barrier layer 4 and the SiN surface protective film 8 directly come into contact with each other to form an interface. A composition ratio Si/N of Si and N that form a Si—N bond of the SiN surface protective film 8 is 0.751 to 0.801.

Figure 2:
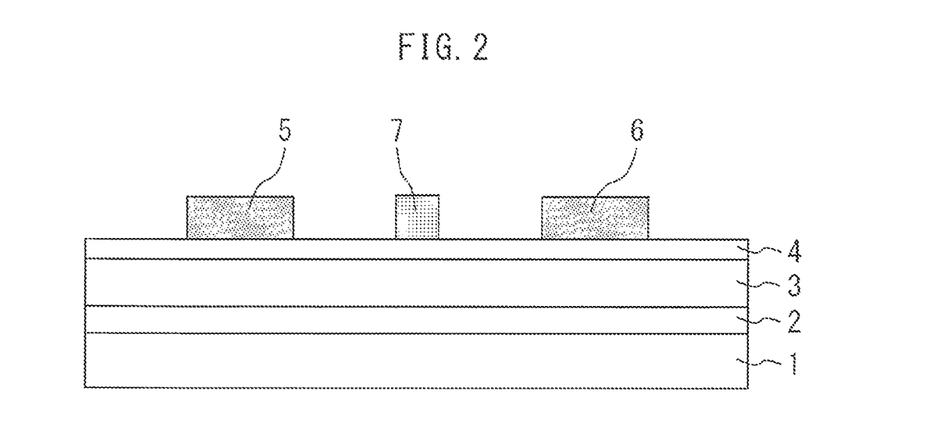
FIG. 2 is a cross-sectional view illustrating manufacturing steps of the semiconductor device according to the first embodiment of the present invention.

Next, a method of manufacturing a semiconductor device according to the present embodiment will be described. FIG. 2 is a cross-sectional view illustrating manufacturing steps of the semiconductor device according to the first embodiment of the present invention.

First, as shown in FIG. 2, the buffer layer 2 made of GaN or AlN is formed on the semi-insulating SiC substrate 1. Next, the GaN channel layer 3 and the AlGaN barrier layer 4 are formed on the buffer layer 2 in that order (AlGaN/GaN structure). Next, the source electrode 5 and the drain electrode 6 made of Ti (20 nm)/Al (100 nm)/Ti (40 nm)/An (30 nm), and the gate electrode 7 made of Ni (50 nm)/Au (300 nm) are formed on the AlGaN barrier layer 4.

Next, as shown in FIG. 1, the SiN surface protective film 8 is formed so as to cover the surface of the AlGaN barrier layer 4. The SiN surface protective film 8 has a film thickness of, for example, 80 nm. As a method of forming the SiN surface protective film 8, an ECR (electron cyclotron resonance) sputtering method having a high degree of freedom of gas flow rate during film formation is used, for example. When a gas flow rate for forming a stoichiometric $Si_3N_4$ film is used as a reference, only a flow rate of $N_2$ gas is assumed to be, for example 90% as a gas flow rate condition during film formation. This makes it possible to form in which a composition ratio Si/N of Si and N that form a Si—N bond falls within 0.751 to 0.801, that is, the SiN surface protective film 8 with excessive Si as a solid. Through the above-described steps, the semiconductor device according to the present embodiment is obtained.

Here, attention is focused on the SiN surface protective film 8 for the purpose of suppressing current collapse, the electronic structure formed on the interface between SiN and the semiconductor surface mainly dominates characteristics of the region and is considered essentially important. When, for example, a system whose outermost surface layer is an AlGaN layer is considered, it is mainly SiN and AlGaN as solids that form a basic electronic structure on the SiN/AlGaN interface. However, in the actual system, Si and N that contribute to other than the formation of SiN depending on the film formation method/condition, or Si and N that couple with to so-called impurity appear, and such Si and N can form an impurity level and an interfacial level. Therefore, it is not possible to define Si and N that contribute to the formation of SiN as a solid by only forming SiN defined by a content ratio, with the result that reproducing even the electron structure on the SiN/AlGaN interface cannot be achieved.

What should be noted here is that current collapse is believed to occur because electrons are trapped in the impurity level and interfacial level with a finite life. These levels are not filled with electrons when there are not biased and are located within an energy range in which electrons can be excited when a high bias is applied. For this reason, it is possible to estimate that electrons are trapped with a finite life when a high bias is applied. On the other hand, there is actually a limit to reductions of these levels. Thus, the inventor has considered that current collapse can be suppressed by lowering the energy position, that is, the energy of the system where electrons can exist even when these levels are non-biased. Thus, as a consequence of conducting experiments and verifications from the standpoint of the electronic structure, the inventor has found that the energy of the system on the SiN/semiconductor interface decreases and current collapse can be reduced by applying SiN in which a composition ratio Si/N of Si and N that form a Si—N bond is 0.751 to 0.801.

Figure 3:
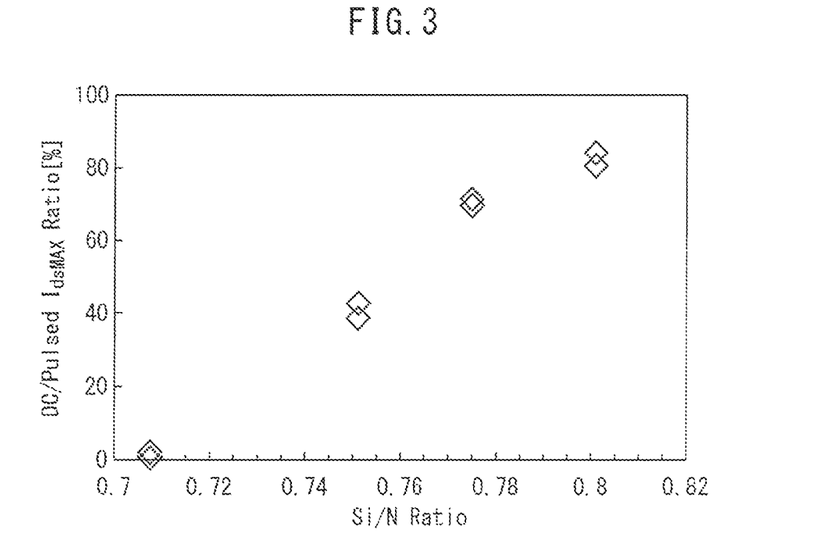
FIG. 3 is a diagram illustrating a ratio between a maximum current value during DC operation and a maximum current value during pulsed operation as an index of current collapse.

FIG. 3 is a diagram illustrating a ratio between a maximum current value during DC operation and a maximum current value during pulsed operation as an index of current collapse. It is observable that the ratio of maximum current values increases as the composition ratio Si/N of Si and N that form a Si—N bond becomes more Si-excessive.

On the other hand, within a range of Si depletion, that is, when Si/N is smaller than 0.751, it is evident that the ratio of the maximum current values significantly decreases, that is, the current collapse phenomenon becomes more noticeable when Si/N is smaller than 0.751. For this reason, in consideration of the fact that SiN is originally applied to suppress a current collapse phenomenon, it is evident that the range of Si depletion is not suitable as a range to be applied.

Figure 4:
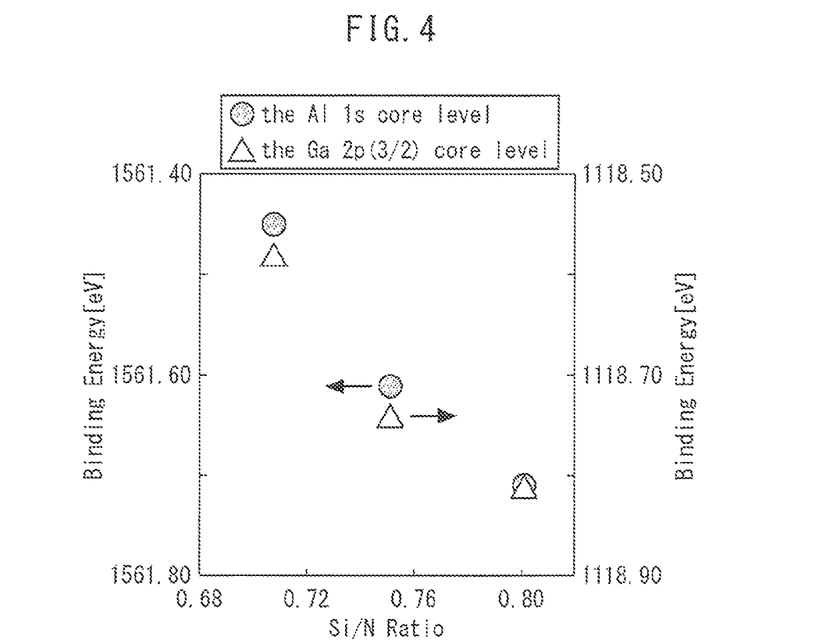
FIG. 4 is a diagram illustrating a comparison of binding energy of inner core levels of Al and Ga on the SiN/AlGaN interface.

FIG. 4 is a diagram illustrating a comparison of binding energy of inner core levels of Al and Ga on the SiN/AlGaN interface. When the composition ratio Si/N of Si and N that form a Si—N bond becomes Si-excessive, the inner core levels of Al and Ga shift to the higher binding energy side and it is observed that the energy of the system of the SiN/AlGaN interface decreases.

However, a refractive index tends to increase as Si of SiN becomes excessive, and film peeling is more likely to occur within the wafer plane, which is therefore not suitable. For this reason, as shown in FIG. 3 and FIG. 4, device characteristics can be confirmed through experiments and when a range that can be actually created is taken into consideration, the composition ratio Si/N of Si and N that forms the Si—N bond has an upper limit level of 0.801.

It is evident from these results that if the composition ratio Si/N of Si and N that form the Si—N bond is 0.751 to 0.801, that is, if Si-excessive SiN is applied as a solid, it is possible to reduce the energy of the system on the SiN/nitride semiconductor interface and obtain the effect of suppressing current collapse.

As described above, in the present embodiment, the composition ratio Si/N of Si and N that form the Si—N bond of the SiN surface protective film 8 is 0.751 to 0.801. This reduces the energy of the SiN/AlGaN interface, making it possible to reduce current collapse with high reproducibility. Moreover, accompanying the suppression of current collapse, high frequency and high output can also be achieved.

Second Embodiment

Figure 5:
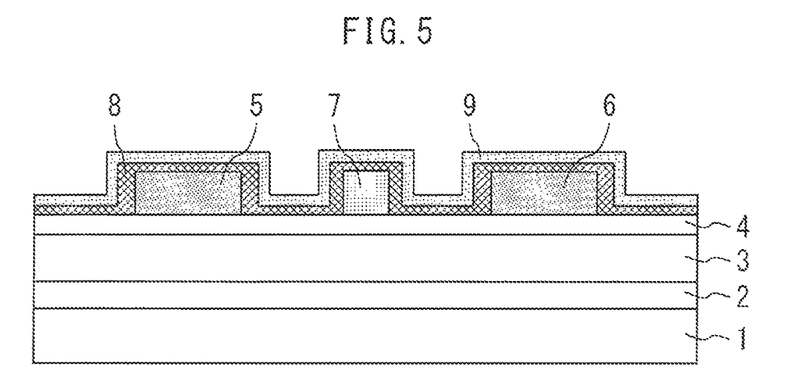
FIG. 5 is a cross-sectional view illustrating a semiconductor device according to a second embodiment of the present invention.

FIG. 5 is a cross-sectional view illustrating a semiconductor device according to a second embodiment of the present invention. An $Al_2O_3$ insulating film 9 having a larger band gap than the SiN surface protective film 8 is provided on the SiN surface protective film 8. The composition ratio Si/N of Si and N that form a Si—N bond of the SiN surface protective film 8 is 0.751 to 0.801 as in the case of the first embodiment. The SiN surface protective film 8 has a film thickness of, for example, 80 nm and the $Al_2O_3$ insulating film 9 has a film thickness of, for example, 50 nm. The rest of the configuration is similar to that of the first embodiment.

Next, a method of manufacturing the semiconductor device according to the present embodiment will be described. First, the buffer layer 2, the GaN channel layer 3 and the AlGaN barrier layer 4 are formed on the substrate 1 in that order. Next, the source electrode 5, the drain electrode 6 and the gate electrode 7 are formed on the AlGaN barrier layer 4. The manufacturing method is similar to that of the first embodiment.

Next, as shown in FIG. 1, the SiN surface protective film 8 (e.g., 80 nm) is formed so as to cover the surface of the AlGaN barrier layer 4. Next, the $Al_2O_3$ insulating film 9 (e.g., 50 nm) is formed on the SiN surface protective film 8. For example, an ECR-sputtering method or ALD (atomic layer deposition) method having excellent film thickness controllability is used as a method of forming the SiN surface protective film 8 and $Al_2O_3$ insulating film 9. It is thereby possible to form the SiN surface protective film 8 in which the composition ratio SUN of Si and N that form a Si—N bond is 0.751 to 0.801 and form the $Al_2O_3$ insulating film 9 having a larger hand gap than the SiN surface protective film 8.

As described above, in the present embodiment, the $Al_2O_3$ insulating film 9 having a larger band gap than the SiN surface protective film 8 is formed on the SiN surface protective film 8. This makes it possible to form a surface protective film having a higher dielectric breakdown voltage than SiN without increasing the energy of the SiN surface protective film 8. It is thereby possible to obtain a dielectric breakdown voltage higher than when only SiN is used while securing the effect of suppressing current collapse. Therefore, reliability of the semiconductor device can be improved compared to the first embodiment.

Note that a case has been described in the present embodiment where the surface protective film is formed by laminating two layers (SiN surface protective film 8 and the $Al_2O_3$ insulating film 9), but without being limited to this, three or more layers may be used. In this case, to obtain an effect of suppressing current collapse, the lowest layer may be the SiN surface protective film 8 in which the composition ratio Si/N of Si and N that form a Si—N bond is 0.751 to 0.801 and layers other than the lowest layer may be insulating films having a larger band gap than that of the lowest layer.

Third Embodiment

Figure 6:
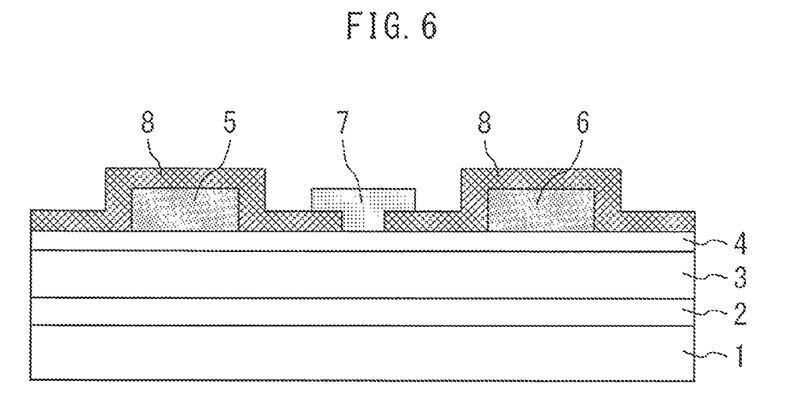
FIG. 6 is a cross-section illustrating a semiconductor device according to a third embodiment of the present invention.

FIG. 6 is a cross-sectional view illustrating a semiconductor device according to a third embodiment of the present invention. Part of the gate electrode 7 is disposed on the SiN surface protective film 8 to form a field plate structure. More specifically, the SiN surface protective film 8 is formed so as to cover the surface of the AlGaN barrier layer 4 and has an opening where the gate electrode 7 is supposed to be formed. The gate electrode 7 is formed so as to fill the opening of the SiN surface protective film 8 and so that part thereof covers the SiN surface protective film 8. The gate electrode 7 is made of Ni (50 nm)/Au (300 nm). The rest of the configuration is similar to that of the first embodiment.

Figure 7:
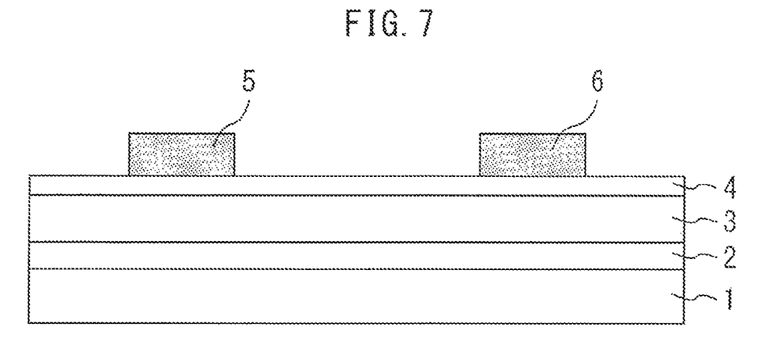
FIGS. 7 to 9 are cross-sectional views illustrating manufacturing steps of the semiconductor device according to the third embodiment of the present invention.
Figure 8:
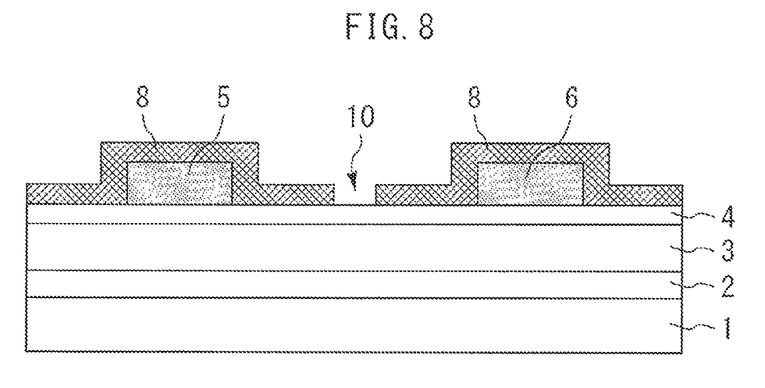
Figure 9:
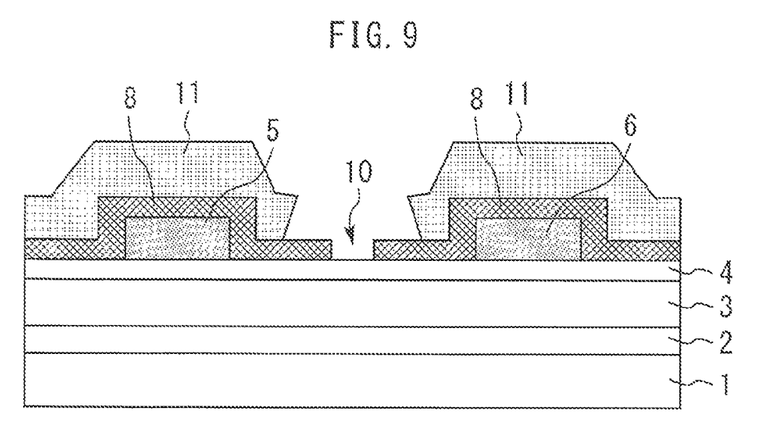

Next, a method of manufacturing the semiconductor device according to the present embodiment will be described. FIGS. 7 to 9 are cross-sectional views illustrating manufacturing steps of the semiconductor device according to the third embodiment of the present invention.

First, as shown in FIG. 7, the buffer layer 2, the GaN channel layer 3 and the AlGaN barrier layer 4 are formed on the substrate 1 in that order, and the source electrode 5 and the drain electrode 6 are formed on the AlGaN barrier layer 4. The manufacturing method is similar to that of the first embodiment. Note that the gate electrode 7 is not formed at this point in time.

Next, as shown in FIG. 8, the SiN surface protective film 8 (e.g., 80 nm) is formed so as to cover the surface of the AlGaN barrier layer 4. An opening 10 (gate opening pattern) is formed on the SiN surface protective film 8 at a location where the gate electrode 7 is supposed to be formed using lithography and dry etching. Next, as shown in FIG. 9, a pattern 11 for forming the gate electrode 7 is formed so as to correspond to the opening of the SiN surface protective film 8 using a lithography method.

Next, the gate electrode 7 is formed in the opening 10 and on the SiN surface protective film 8 by applying a vapor deposition lift-off method using Ni (50 nm)/Au (300 nm) similar to that in the first embodiment. As a result, as shown in FIG. 6, part of the gate electrode 7 is disposed on the SiN surface protective film 8 to form a field plate structure.

As described above, in the present embodiment, it is possible to reduce concentration of the electric field through the field plate structure while achieving the effect of suppressing current collapse as in the case of the first embodiment. For this reason, it is possible to suppress trapping of electrons into an impurity level and an interfacial level accompanying concentration of the electric field and further suppress a reverse leakage current via those levels. That is, since the present embodiment can further improve the effect of suppressing current collapse, reduce a reverse leakage current and thereby improve electric characteristics and reliability compared to the first embodiment.

Note that a case has been described in the present embodiment where the surface protective film has one layer, but without being limited to this, the surface protective film may have a plurality of layers laminated one on another as in the case of the second embodiment. In this case, the lowest layer may be the SiN surface protective film 8 in which the composition ratio Si/N of Si and N that form a Si—N bond is 0.751 to 0.801 and layers other than the lowest layer may be insulating films having a larger baud gap than that of the lowest layer.

Fourth Embodiment

Figure 10:
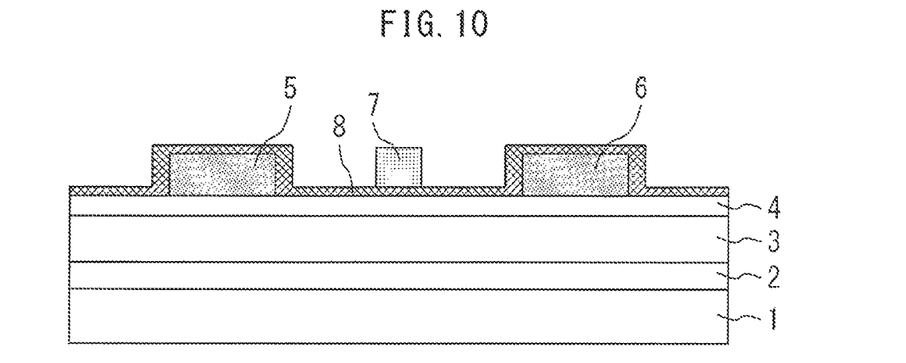
FIG. 10 is a cross-sectional view illustrating a semiconductor device according to a fourth embodiment of the present invention.

FIG. 10 is a cross-sectional view illustrating a semiconductor device according to a fourth embodiment of the present invention. The gate electrode 7 is formed on the SiN surface protective film 8, and the gate electrode 7, the SiN surface protective film 8 and the AlGaN barrier layer 4 (nitride semiconductor layer) form a MIS (metal insulator-semiconductor) structure. That is, the SiN surface protective film 8 is provided with both the function of protecting the surface of the semiconductor device and the function as an insulating film having the MIS structure. The SiN surface protective film 8 has a film thickness of, for example, 5 nm. The gate electrode 7 is made of Ni (50 nm)/Au (300 nm). The rest of the configuration is similar to that of the first embodiment.

Figure 11:
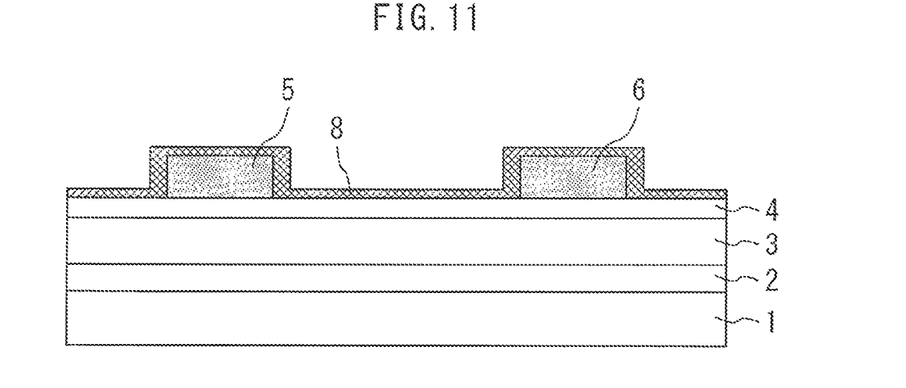
FIGS. 11 and 12 are cross-sectional views illustrating manufacture steps of the semiconductor device according to the fourth embodiment of the present invention.
Figure 12:
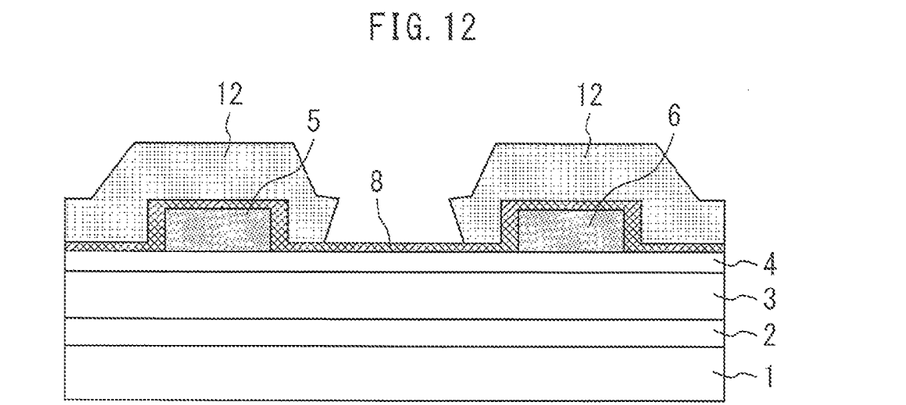

Next, a method of manufacturing the semiconductor device according to the present embodiment will be described. FIGS. 11 and 12 are cross-sectional views illustrating manufacturing steps of the semiconductor device according to the fourth embodiment of the present invention.

First, as shown in FIG. 11, the buffer layer 2, the GaN channel layer 3 and the AlGaN barrier layer 4 are formed on the substrate 1 in that order, and the source electrode 5 and the drain electrode 6 are formed on the AlGaN barrier layer 4. The manufacturing method is similar to that of the first embodiment. Note that the gate electrode 7 is not formed at this point in time. Next, the SiN surface protective film 8 (e.g., 5 nm) is formed so as to cover the AlGaN barrier layer 4, the source electrode 5 and the surface of the drain electrode 6.

Next, as shown in FIG. 12, a pattern 12 for forming the gate electrode 7 is formed on the SiN surface protective film 8 using a lithography method. Next, the gate electrode 7 is formed by applying a vapor deposition lift-off method to the pattern 12 using Ni (50 nm)/Au (300 nm) similar to that in the first embodiment. As a result, a semiconductor device having a MIS structure is formed as shown in FIG. 10.

In a semiconductor device having the MIS structure, a surface protective film is formed also in the region of the nitride semiconductor surface where the gate electrode 7 having the MES structure is formed. For this reason, current collapse caused by the interface between the surface protective film and the nitride semiconductor surface is more dominant. The semiconductor device having the MIS structure has less reverse leakage current and higher reliability than the semiconductor device having a MES structure for the structure-related reasons. Therefore, the semiconductor device having the MIS structure in the present embodiment can obtain effects of suppressing current collapse while securing reliability.

Fifth Embodiment

Figure 13:
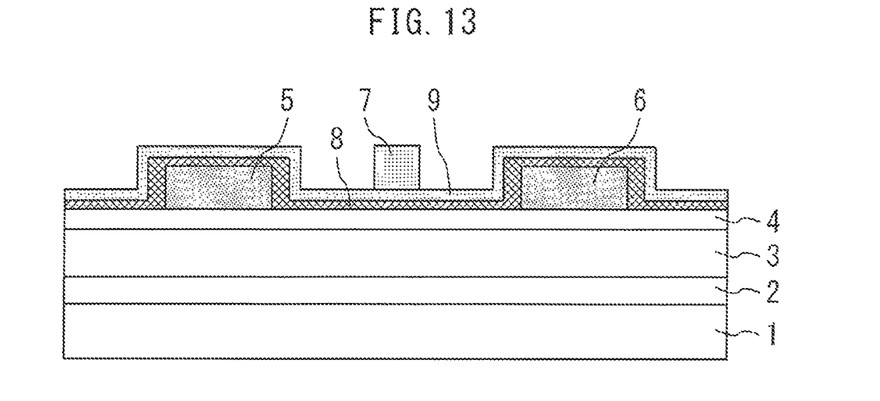
FIG. 13 is a cross-sectional view illustrating a semiconductor device according to a fifth embodiment of the present invention.

FIG. 13 is a cross-sectional view illustrating a semiconductor device according to a fifth embodiment of the present invention. An $Al_2O_3$ insulating film 9 having a larger band gap than the SiN surface protective film S is provided on the SiN surface protective film S. The composition ratio Si/N of Si and N that form a Si—N bond of the SiN surface protective film 8 is 0.751 to 0.801. The SiN surface protective film 8 has a film thickness of for example, 5 nm and the $Al_2O_3$ insulating film 9 has a film thickness of, for example, 5 nm. The gate electrode 7 is formed on the SiN surface protective film S as in the case of the fourth embodiment. The gate electrode 7 is made of Ni (50 nm)/Au (300 nm) as in the case of the fourth embodiment.

Figure 14:
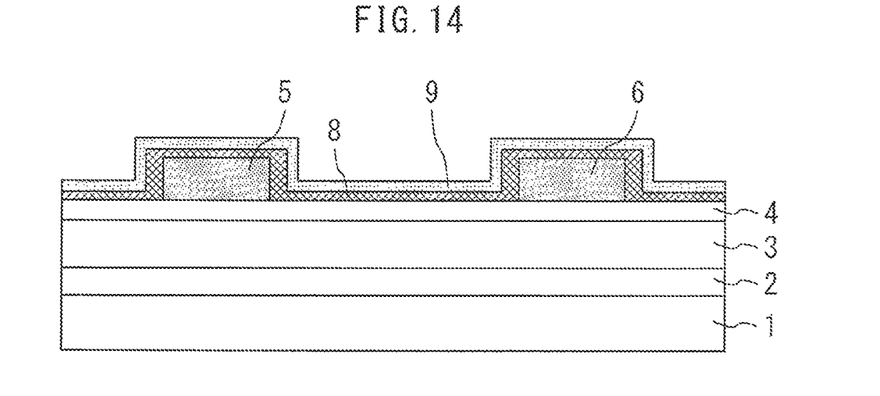
FIGS. 14 and 15 are cross-sectional views illustrating manufacturing steps of the semiconductor device according to the fifth embodiment of the present invention.
Figure 15:
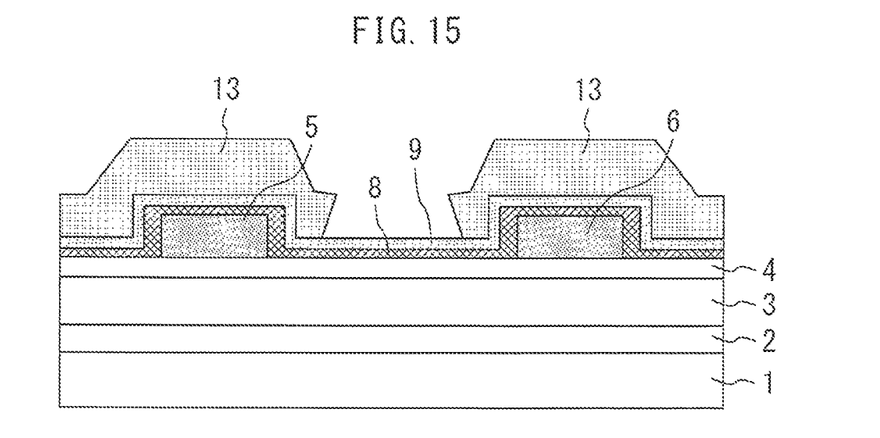

Next, a method of manufacturing the semiconductor device according to the present embodiment will be described. FIGS. 14 and 15 are cross-sectional views illustrating manufacturing steps of the semiconductor device according to the fifth embodiment of the present invention.

First, as in the case of the fourth embodiment, the buffer layer 2, the GaN channel layer 3 and the AlGaN barrier layer 4 are formed on the substrate 1 in that order, and the source electrode 5 and the drain electrode 6 are formed on the AlGaN barrier layer 4. Note that the gate electrode 7 is not formed at this point in time.

Next, as shown in FIG. 14, the SiN surface protective film 8 (e.g., 5 nm) is formed so as to cover the surface of the AlGaN barrier layer 4. Next, the $Al_2O_3$ insulating film 9 (e.g., 5 nm) is formed on the SiN surface protective film 8. For example, an ECR-sputtering method or an ALD method having excellent film thickness controllability is used as the method of forming the SiN surface protective film 8 and the $Al_2O_3$ insulating film 9.

Next, as shown in FIG. 15, a pattern 13 for forming the gate electrode 7 is formed on the $Al_2O_3$ insulating film 9 using a lithography method. Next, the gate electrode 7 is formed by applying a vapor deposition lift-off method to the pattern 13 using Ni (50 nm)/Au (300 nm) similar to that in the fourth embodiment. As a result, a semiconductor device having a MIS structure is obtained as shown in FIG. 13.

As described above, in the present embodiment, the $Al_2O_3$ insulating film 9 having a larger band gap than the SiN surface protective film 8 is formed on the SiN surface protective film 8. This makes it possible to obtain a higher dielectric breakdown voltage than when only SiN is applied while securing the effect of suppressing current collapse. Furthermore, it is possible to obtain an effect of suppressing current collapse while securing reliability in the semiconductor device having a MIS structure as in the case of the fourth embodiment.

Note that a case has been described in the present embodiment where the surface protective film is formed by laminating two layers (SiN surface protective film 8 and the $Al_2O_3$ insulating film 9), but without being limited to this, three or more layers may be used. In this case, to achieve the effect of suppressing current collapse, the lowest layer may be the SiN surface protective film 8 in which the composition ratio SiN of Si and N that form a Si—N bond is 0.751 to 0.801 and layers other than the lowest layer may be insulating films having a larger band gap than the lowest layer.

Sixth Embodiment

Figure 16:
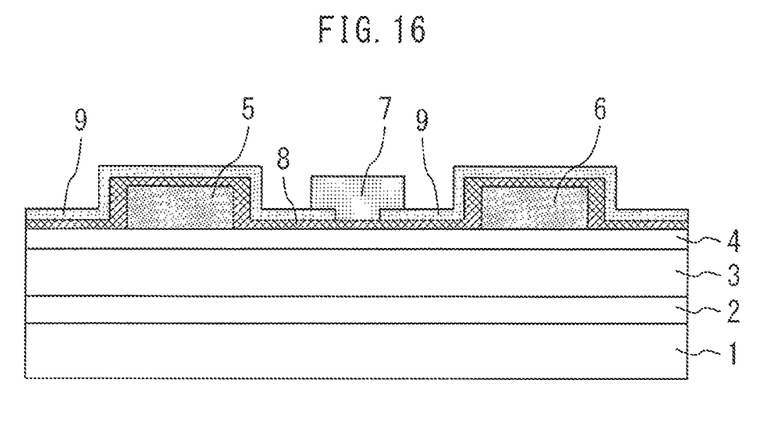
FIG. 16 is a cross-sectional view illustrating a semiconductor device according to a sixth embodiment of the present invention.

FIG. 16 is a cross-sectional view illustrating a semiconductor device according to a sixth embodiment of the present invention. The gate electrode 7 is formed on the SiN surface protective film 8, and the gate electrode 7, the SiN surface protective film 8 and the AlGaN barrier layer 4 (nitride semiconductor layer) form a MIS structure. Moreover, the $Al_2O_3$ insulating film 9 having a larger hand gap than that of the SiN surface protective film 8 is provided on the SiN surface protective film 8. The composition ratio SiN of Si and N that form a Si—N bond of the SiN surface protective film 8 is 0.751 to 0.801. The SiN surface protective film 8 has a film thickness of, for example, 5 nm and the $Al_2O_3$ insulating film 9 has a film thickness of, for example, 5 nm.

An opening is formed in the $Al_2O_3$ insulating film 9 at a location where the gate electrode 7 is supposed to be formed. The gate electrode 7 is formed so as to fill the opening of the $Al_2O_3$ insulating film 9 and so that part thereof covers the $Al_2O_3$ insulating film 9. The gate electrode 7 is made of Ni (50 nm)/Au (300 nm). Thus, part of the gate electrode 7 is disposed on the $Al_2O_3$ insulating film 9 to form a field plate structure. The rest of the configuration is similar to that of the fifth embodiment.

Figure 17:
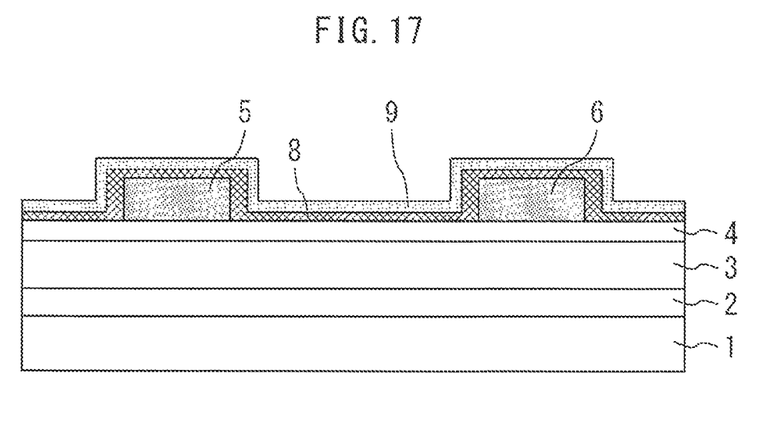
FIGS. 17 to 19 are cross-sectional views illustrating manufacturing steps of the semiconductor device according to the sixth embodiment of the present invention.
Figure 18:
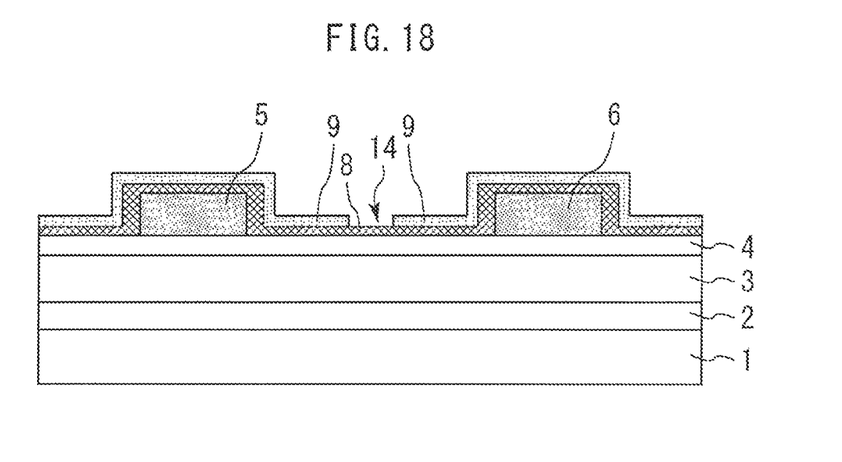
Figure 19:
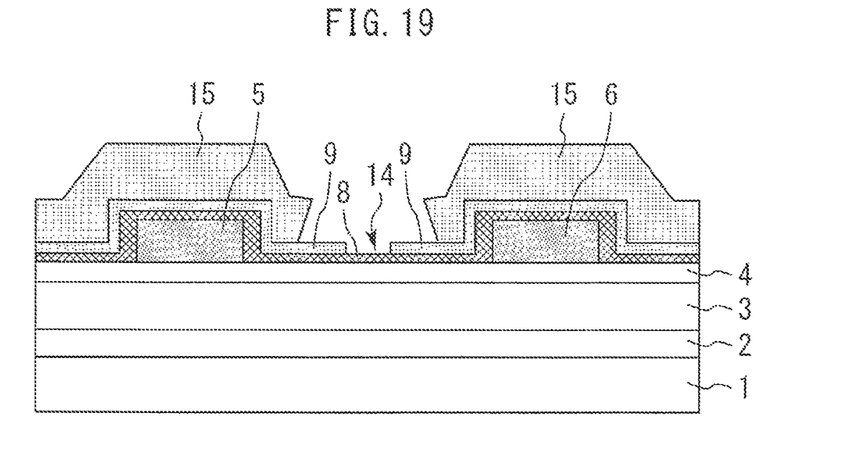

Next, a method of manufacturing the semiconductor device according present embodiment will be described. FIGS. 17 to 19 are cross-sectional views illustrating manufacturing steps of the semiconductor device according to the sixth embodiment of the present invention.

First, as in the case of the fifth embodiment, the buffer layer 2, the GaN channel layer 3 and the AlGaN barrier layer 4 are formed on the substrate 1 in that order, and the source electrode 5 and the drain electrode 6 are formed on the AlGaN barrier layer 4. Note that the gate electrode 7 is not formed at this point in time.

Next, as shown in FIG. 17, the SiN surface protective film 8 (e.g., 5 nm) is formed so as to cover the surface of the AlGaN barrier layer 4. Next, the $Al_2O_3$ insulating film 9 (e.g., 5 nm) is formed on the SiN surface protective film 8. For example, an ECR-sputtering method or an ALD method with excellent film thickness controllability is used as a method of forming the SiN surface protective film 8 and $Al_2O_3$ insulating film 9.

Next, as shown in FIG. 18, an opening 14 (gate opening pattern) is formed in the $Al_2O_3$ insulating film 9 at a location where the gate electrode 7 is supposed to be formed using lithography and dry etching. Examples of the method of forming the opening 14 in the $Al_2O_3$ insulating film 9 include dry etching using a chlorine gas, a methane gas or an argon gas or wet etching using a strong alkaline developer.

Next, as shown in FIG. 19, a pattern 15 for forming the gate electrode 7 on the $Al_2O_3$ insulating film 9 is formed using a lithography method. Next, the gate electrode 7 is formed in the opening 14 and on the $Al_2O_3$ insulating film 9 by applying a vapor deposition lift-off method to the pattern 15 using Ni (50 nm)/An (300 nm) as in the case of the fifth embodiment. As a result, a semiconductor device having a MIS structure and a field plate structure is obtained as shown in FIG. 16.

As described above, according to the present embodiment, it is possible to obtain an effect of suppressing current collapse using a field plate structure and an effect of improving reliability in addition to the effects of the fifth embodiment.

Note that a case has been described in the present embodiment where the surface protective film is formed by laminating two layers (SiN surface protective film 8 and $Al_2O_3$ insulating film 9), but without being limited to this, three or more layers may be used. In this case, to obtain the effect of suppressing current collapse, the lowest layer may be the SiN surface protective film 8 in which the composition ratio Si/N of Si and N that form a Si—N bond is 0.751 to 0.801 and layers other than the lowest layer may be insulating films having a larger band gap than that of the lowest layer.

Note that the above-described embodiments may be freely combined and the respective embodiments may be modified or omitted as appropriate without departing from the scope of the present invention.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-186744, filed on Sep. 24, 2015 including specification, claims, drawings and summary, on which the Convention priority of the present application is based, is incorporated herein by reference in its entirety.

The invention claimed is:

1. A semiconductor device comprising:
a substrate;
a nitride semiconductor layer on the substrate;
a source electrode, a drain electrode and a gate electrode on the nitride semiconductor layer; and
a SiN surface protective film covering the nitride semiconductor layer, the SiN surface protective film including Si and N that form a Si—N bond and other Si and N that are coupled to interfacial or impurity levels,
wherein a composition ratio Si/N of Si and N that form the Si—N bond is 0.751 to 0.801.

2. The semiconductor device of claim 1, wherein the nitride semiconductor layer includes a GaN channel layer and an AlGaN barrier layer on the GaN channel layer,
the AlGaN barrier layer and the SiN surface protective film directly come into contact with each other to form an interface, and
the semiconductor device is a heterostructure field-effect transistor.

3. The semiconductor device of claim 1, wherein the gate electrode is Schottky-connected to the nitride semiconductor layer to form a MES (metal-semiconductor) structure.

4. The semiconductor device of claim 1, further comprising an insulating film having a larger band gap than the SiN surface protective film and on the SiN surface protective film.

5. The semiconductor device of claim 1, wherein part of the gate electrode is disposed on the SiN surface protective film to form a field plate structure.

6. The semiconductor device of claim 1, wherein the gate electrode is disposed on the SiN surface protective film to form a MIS (metal insulator-semiconductor) structure.

7. The semiconductor device of claim 6, further comprising an insulating film having a larger band gap than the SiN surface protective film and on the SiN surface protective film.

8. The semiconductor device of claim 7, wherein part of the gate electrode is disposed on the insulating film to form a field plate structure.

9. A method of manufacturing a semiconductor device comprising:
forming a nitride semiconductor layer on a substrate;
forming a source electrode, a drain electrode and a gate electrode on the nitride semiconductor layer; and
forming a SiN surface protective film covering the nitride semiconductor layer, the SiN surface protective film including Si and N that form a Si—N bond and other Si and N that are coupled to interfacial or impurity levels,
wherein a composition ratio Si/N of Si and N that form the Si—N bond is 0.751 to 0.801.

10. The method of manufacturing a semiconductor device of claim 9, comprising forming a GaN channel layer and an AlGaN barrier layer as the nitride semiconductor layer in that order, wherein the AlGaN barrier layer and the SiN surface protective film directly come into contact with each other to form an interface, and the semiconductor device is a heterostructure field-effect transistor.

11. The method of manufacturing a semiconductor device of claim 9, comprising Schottky-connecting the gate electrode to the nitride semiconductor layer to form a MES (metal-semiconductor) structure.

12. The method of manufacturing a semiconductor device of claim 9, comprising forming an insulating film having a larger band gap than the SiN surface protective film on the SiN surface protective film.

13. The method of manufacturing a semiconductor device of claim 9, comprising:

forming an opening on the SiN surface protective film; and forming the gate electrode in the opening and on the SiN surface protective film, wherein part of the gate electrode is disposed on the SiN surface protective film to form a field plate structure.

14. The method of manufacturing a semiconductor device of claim 9, comprising forming the gate electrode on the SiN surface protective film to form a MIS (metal insulator-semiconductor) structure.

15. The method of manufacturing a semiconductor device of claim 14, comprising forming an insulating film having a larger band gap than the SiN surface protective film on the SiN surface protective film.

16. The method of manufacturing a semiconductor device of claim 15, comprising:

forming an opening on the insulating film; and forming the gate electrode in the opening and on the insulating film, wherein part of the gate electrode is disposed on the insulating film to form a field plate structure.

* * * * *